United States Patent [19]
Niisoe

[11] Patent Number: 6,002,145
[45] Date of Patent: Dec. 14, 1999

[54] SOLID-STATE IMAGING DEVICE

[75] Inventor: Naoto Niisoe, Kyoto, Japan

[73] Assignee: Matsushita Electronics Corporation, Osaka, Japan

[21] Appl. No.: 09/028,375

[22] Filed: Feb. 24, 1998

[30] Foreign Application Priority Data

Feb. 25, 1997 [JP] Japan .................................... 9-041044

[51] Int. Cl.$^6$ ........................ H01L 27/148; H01L 29/768
[52] U.S. Cl. .......................... 257/222; 257/233; 257/432; 257/435
[58] Field of Search .................................. 257/222, 232, 257/233, 432, 435

[56] References Cited

U.S. PATENT DOCUMENTS

| | | | |
|---|---|---|---|
| 4,935,794 | 6/1990 | Miyatake | 257/232 |
| 5,479,049 | 12/1995 | Aoki et al. | 257/232 |
| 5,614,741 | 3/1997 | Harada et al. | 257/222 |
| 5,691,548 | 11/1997 | Akio | 257/232 |

FOREIGN PATENT DOCUMENTS 06061468  3/1994  Japan .

*Primary Examiner*—Gene M. Munson
*Attorney, Agent, or Firm*—Morrison & Foerster LLP

[57] ABSTRACT

A solid-state imaging device comprises photodiodes arranged in columns on a light receiving region, and CCDs arranged in alternations with the columns of the photodiodes; wherein, when charges are stored, a potential barrier of an isolation area between CCDs formed between the photodiodes and the CCDs is formed higher with respect to signal charges than a potential barrier of an isolation area between photodiodes formed between the photodiodes. By this solid-state imaging device, signal charges generated by the incident light on this isolation area between photodiodes can appropriately be stored in the photodiodes. Therefore, it is not necessary to form a metal shielding film on the isolation area between photodiodes, and the efficient area of the photodiodes is increased by taking the area of the photodiodes at maximum. Thus, high sensitivity is obtained.

7 Claims, 14 Drawing Sheets

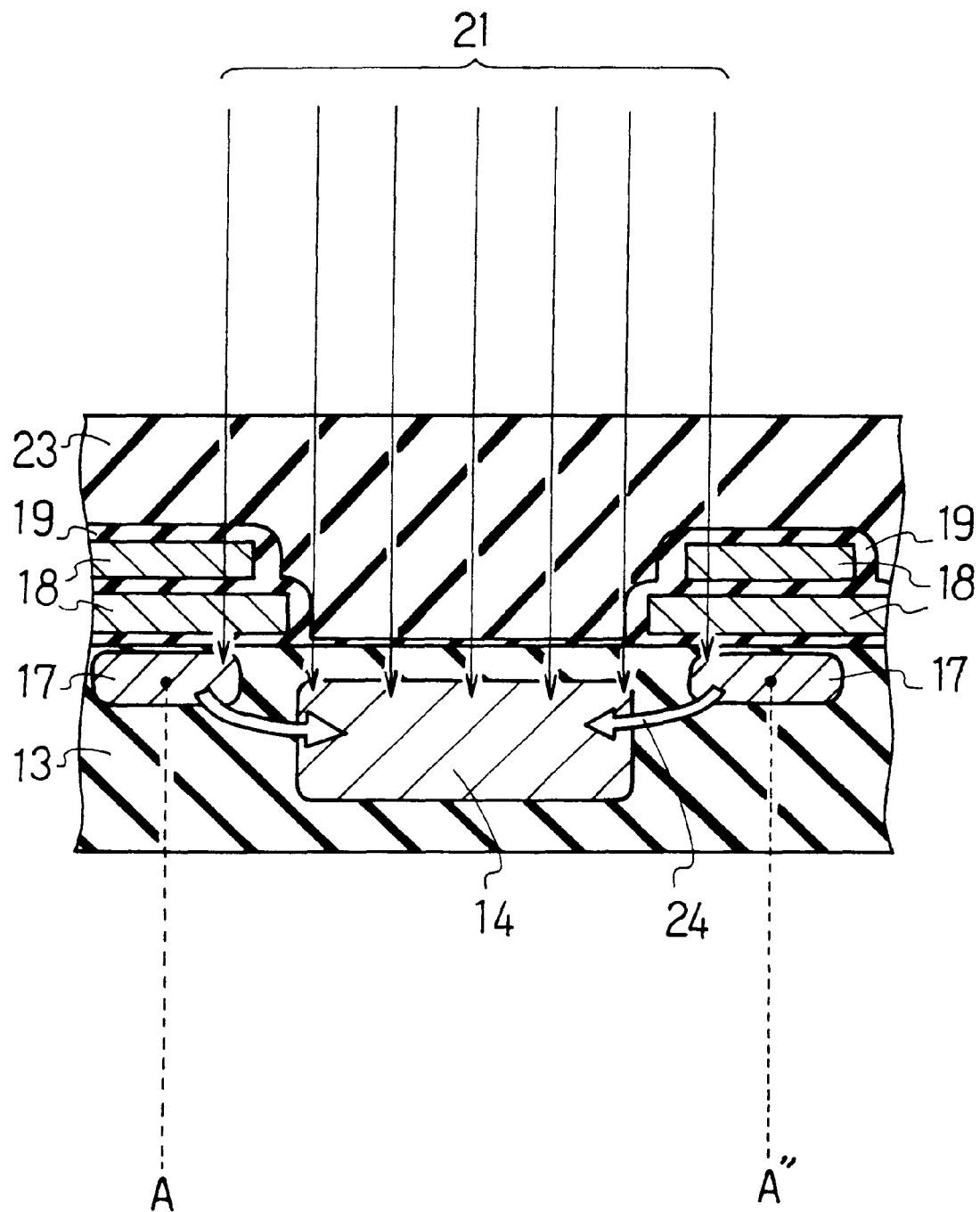
F I G. 3

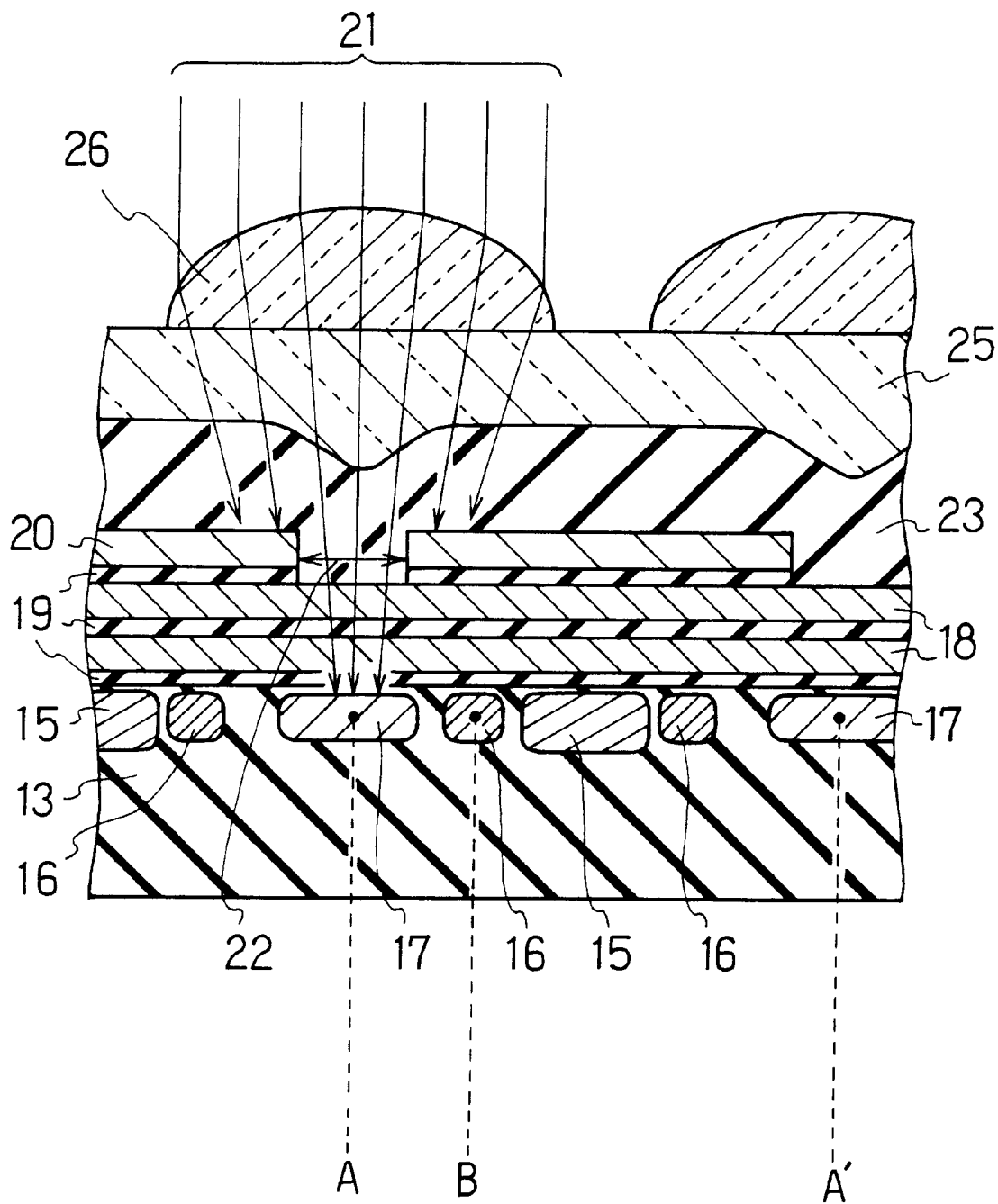
F I G. 6

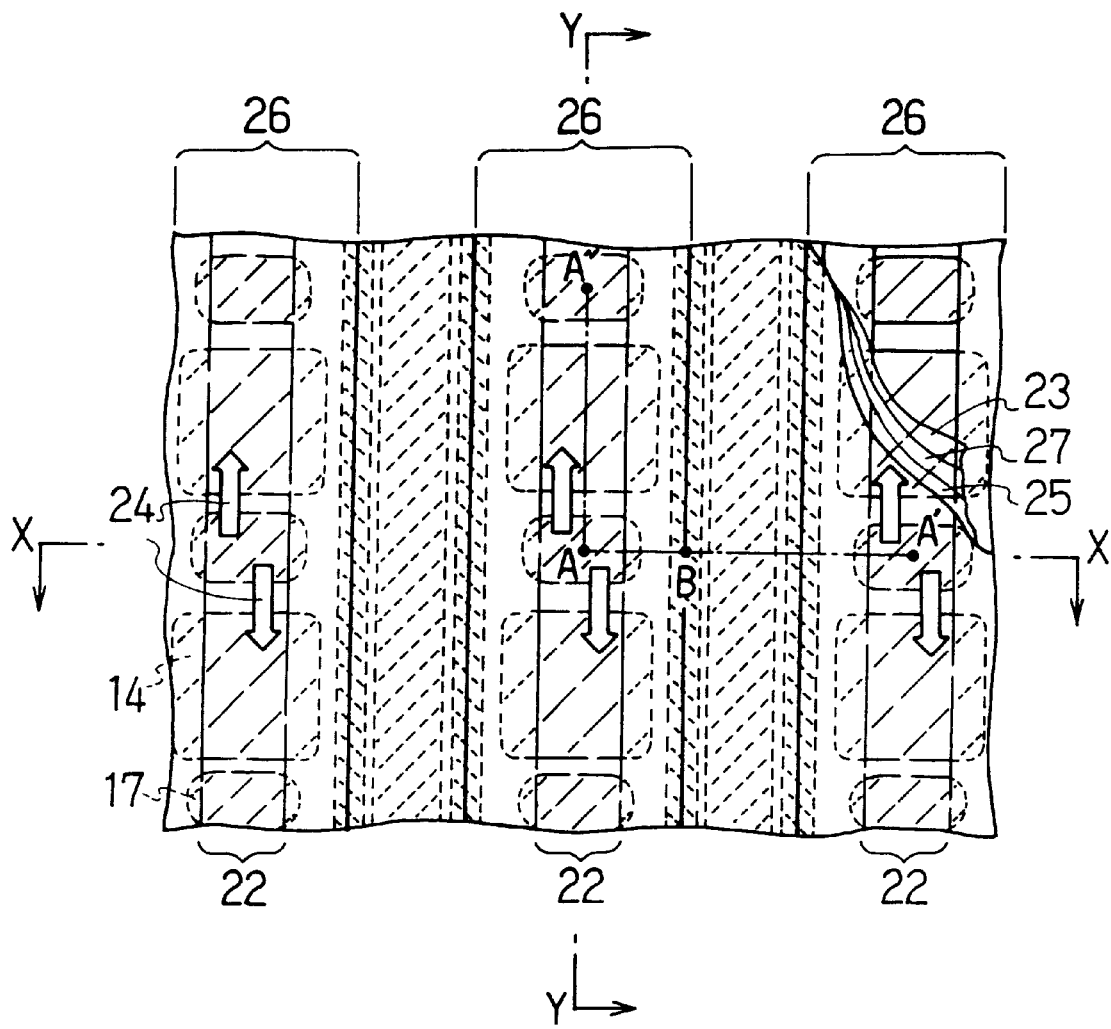
F I G. 8

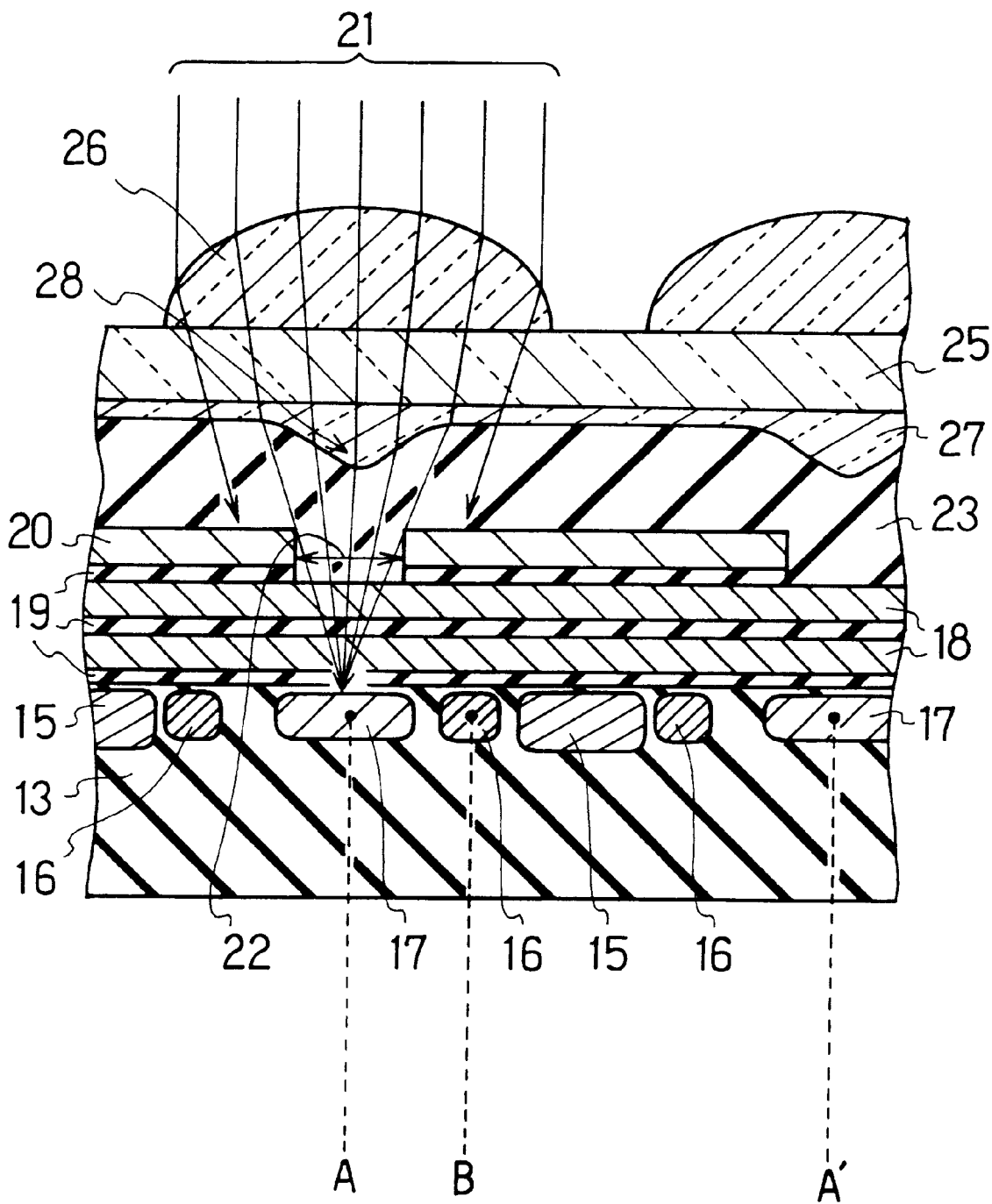
F I G. 9

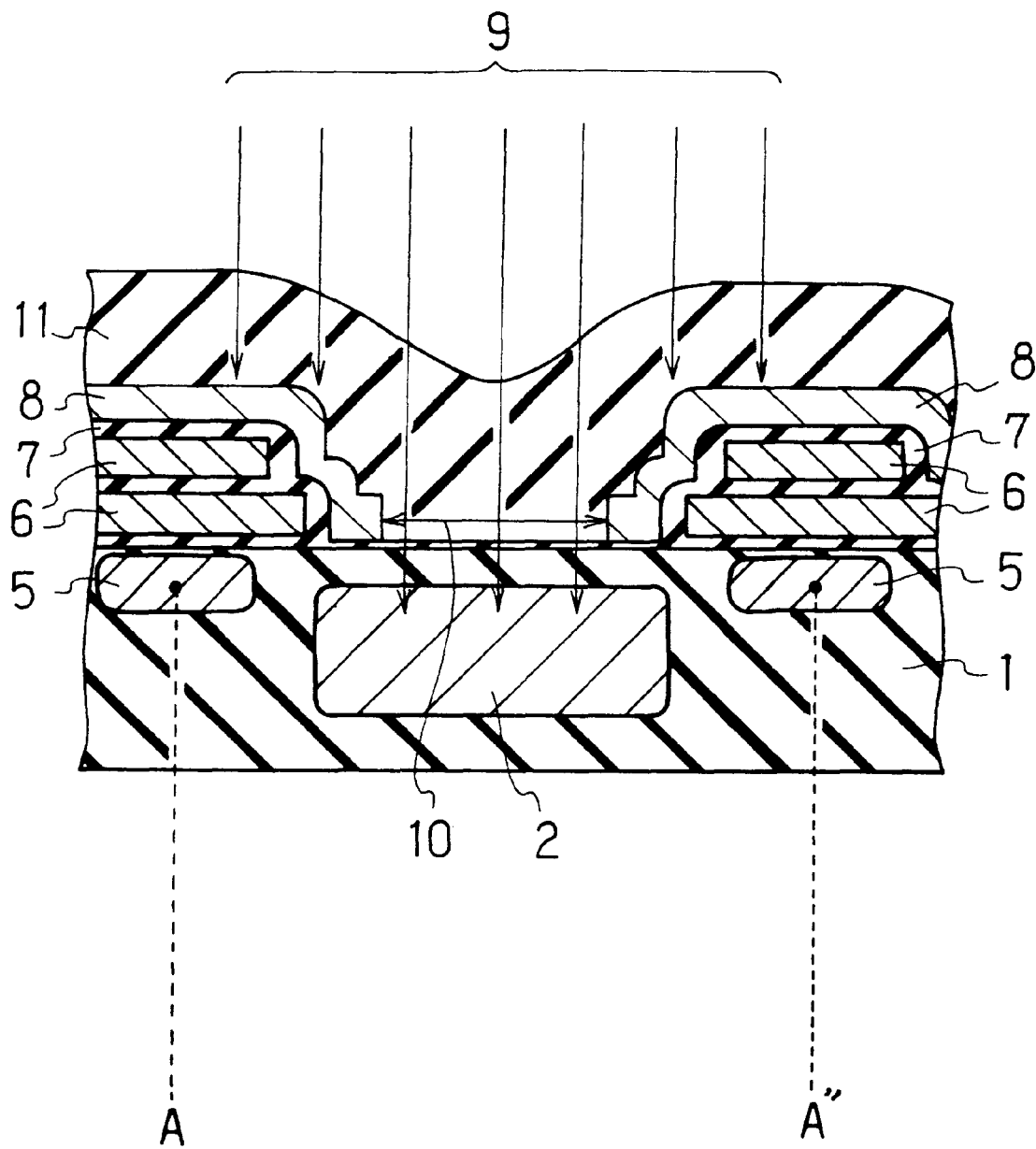
F I G. 1 3

SOLID-STATE IMAGING DEVICE

FIELD OF THE INVENTION

The invention generally relates to a solid-state imaging device, and more specifically, to a solid-state imaging device capable of obtaining high sensitivity by reducing smear and increasing the effective area of photodiode.

BACKGROUND OF THE INVENTION

Recently, miniaturization and high quality of solid-state imaging elements constituting a solid-state imaging device have been developed, and the technique for manufacturing solid-state imaging devices has also been made finer. Accordingly, improving the sensitivity and reducing smear have been required.

An example of a solid-state imaging device of the prior art is hereby explained with reference to the drawings (FIGS. 11 to 14).

FIG. 11 is an enlarged plan view of a part of a light receiving region of a solid-state imaging device of the prior art. FIG. 12 is a cross sectional view taken along line X—X of FIG. 11, and FIG. 13 is a sectional view taken along line Y—Y of FIG. 11. FIG. 14 shows a potential distribution at a cross section taken along line A"-A-B-A' of FIG. 11 when charges are stored.

As is apparent from the above figures, the solid-state imaging device of the prior art comprises a semiconductor substrate 1, a photodiode 2, a vertical charge coupled device (CCD) 3, an isolation area 4 between CCDs, an isolation area 5 between photodiodes, a polysilicon electrode 6, an oxide film 7, a metal shielding film 8, an aperture 10 of the shielding film, and an insulating film 11. Moreover, each figure illustrates the motion of signal charges 12 generated by incident light 9.

Next, specific structure of the above mentioned solid-state imaging device is explained.

The semiconductor substrate 1 is a silicon mono-crystal. A p-type well is formed on a part forming the light receiving region by implantation of ions. The photodiode 2 is formed in the p-type well by implantation of n-type arsenic, phosphorus, or the like. Similarly, the vertical CCD 3 is formed in the p-type well by implantation of n-type arsenic, phosphorus, or the like.

The isolation area 4 between CCDs is formed between the photodiode 2 and the vertical CCD 3, which forms a potential barrier by implantation of p-type boron, etc. Similarly, the isolation area 5 between photodiodes is formed between neighboring photodiodes 2, which forms a potential barrier by implantation of p-type boron, etc.

The polysilicon electrode 6 is formed on the vertical CCD 3. By this polysilicon electrode 6, the potential of the vertical CCD 3 is controlled. The oxide film 7 is formed on the polysilicon electrode 6 in such a manner that it covers a surface of the polysilicon electrode 6. The metal shielding film 8 is formed on the oxide film 7 and shields the vertical CCD 3 from incident light 9 to prevent smearing. The aperture 10 of the shielding film for receiving incident light 9 is formed on the photodiode 2. The insulating film 11 is formed on the metal shielding film 8. This insulating film 11 protects the solid-state imaging device.

In the solid-state imaging device according to the prior art having the above mentioned structure, signal charges are generated through photoelectric conversion of the incident light 9 by the photodiode 2 formed on the semiconductor substrate 1. Then, these signal charges are read out to the vertical CCD 3.

However, in the solid-state imaging device according to the prior art, if the p-type concentration of the isolation area between photodiodes is compared with the p-type concentration of the isolation area between CCDs, then the dose of implanted ions to the isolation area between photodiodes is greater than that to the isolation area between CCDs. Consequently, when charges are stored, the potential barrier of the isolation area 5 between photodiodes is higher than the potential barrier of the isolation area between CCDs (see FIG. 14). Thus, since the potential barrier of the isolation area between CCDs (point B) is low, signal charges generated by incident light to the isolation area between photodiodes (point A) are not stored in the photodiode but directly enter (spill over into) the vertical CCD. As a result, the problem of smearing occurs due to these signal charges spilling over into the vertical CCDs.

In order to avoid the above problems, a shielding film is usually formed on the isolation area between photodiodes so as to shield the incident light. However, if a shielding film is formed on the isolation area between photodiodes in consideration of a process margin for preventing dislocation when a mask of the aperture for the photodiode is aligned, or a coverage of the step difference of a base with the shielding film, then the width of the aperture of the shielding film is considerably limited and the effective area of the photodiode is reduced, thus causing a problem that hindered improvement of sensitivity.

Moreover, even if the shielding film is formed on the isolation area between photodiodes, there arises a problem that signal charges generated by a part of the incident light passing through the aperture are directly taken into the vertical CCD due to drift, and smear occurs. One way of avoiding this problem is to reduce the area of the aperture of the shielding film. Reducing the area of the aperture of the shielding film deteriorates the sensitivity of the solid-state imaging device.

SUMMARY OF THE INVENTION

It is an object of the invention to provide a solid-state imaging device capable of increasing the effective area of photodiode and obtaining high sensitivity by forming a structure which appropriately stores photodiodes with signal charges generated by incident light entering the isolation area between photodiodes and by increasing the effective area of photodiodes since the area of photodiodes is taken at its maximum without forming a metal shielding film on the isolation area between photodiodes.

In order to accomplish the above object, a solid-state imaging device of the invention comprises photodiodes arranged in columns on a light receiving region, and CCDs arranged in alternations with the columns of the photodiodes; wherein, when charges are stored, a potential barrier of an isolation area between CCDs formed between the photodiodes and the CCDs is formed higher with respect to signal charges than a potential barrier of an isolation area between photodiodes formed between the photodiodes. By the solid-state imaging device of the invention, since the potential barrier of the isolation area between CCDs is formed higher than the potential barrier of the isolation area between photodiodes with respect to the signal charges, the signal charges generated by incident light to the isolation area between photodiodes do not directly enter the CCDs, but are appropriately stored in the photodiodes. Consequently, it is not necessary to shield the isolation area between photodiodes with a metal shielding film. Therefore, it is possible for the photodiodes to take a maximum area of the aperture in the direction in which the photodiodes and the isolation area between photodiodes are continuously arranged (hereafter "the longitudinal direction of the photodiodes" will be used).

Moreover, it is preferable in the solid-state imaging device of the invention that an aperture of a metal shielding film which covers the CCD and the isolation area between CCDs is strip-shaped and is oriented parallel to the arranged CCDs. As mentioned above, by the solid-state imaging device of the invention, since signal charges generated by the incident light to the isolation area between photodiodes are appropriately stored in the photodiodes, only the charge transfer portion (the CCDs and the isolation area between CCDs) needs to be shielded. Therefore, the aperture of the metal shielding film can be provided in such a manner that it is stripe-shaped and is oriented parallel to the arranged CCDs. The width of the aperture of the light receiving region is effectively the same as a pixel size in the longitudinal direction of the photodiodes, and the area of the aperture can be taken at its maximum. Thus, the sensitivity can be improved.

Moreover, it is preferable that the solid-state imaging device of the invention comprises an on-chip microlens layer for condensing incident light on the photodiode. By such a preferred embodiment, since incident light can be condensed by the on-chip microlens, the sensitivity can further be improved.

Moreover, it is preferable in the solid-state imaging device of the invention that the on-chip microlens layer is a lenticular type and is oriented parallel to the arranged CCD. By such a preferred embodiment, since the on-chip microlens layer is of the lenticular type, it can easily be manufactured. Moreover, since the on-chip microlens layer is of the lenticular type, the width of the aperture of the light receiving region in the direction perpendicular to the longitudinal direction of the photodiodes can also be increased, and the area of the aperture can further be increased. Therefore, incident light can efficiently be condensed on the photodiodes and the sensitivity can further be improved.

Moreover, it is preferable that the solid-state imaging device of the invention comprises an insulating film arranged on the photodiodes, and a flattening layer formed on the insulating film, in which the flattening layer is made of a material whose refractive index is higher than that of the insulating film, and functions as a convex lens. By such a preferred embodiment, incident light can be condensed by the flattening layer that functions as the convex lens. Thus, the sensitivity can further be improved.

Moreover, it is preferable in the solid-state imaging device of the invention that the flattening layer is a lenticular type and is oriented parallel to the arranged CCDs. By such a preferred embodiment, since the flattening layer is of the lenticular type, it can easily be manufactured. Moreover, since the flattening layer is of the lenticular type, the width of the aperture of the light receiving region in the direction perpendicular to the longitudinal direction of the photodiode can also be widened, and the area of the aperture is further increased. Therefore, incident light can efficiently be condensed on the photodiodes, and the sensitivity can further be improved.

Furthermore, the solid-state imaging device of the invention comprises photodiodes arranged in columns on a light receiving region, and CCDs arranged in alternations with the columns of the photodiodes; wherein, when charges are stored, a potential barrier of an isolation area between CCDs formed between the photodiodes and the CCDs is formed higher with respect to signal charge than a potential barrier of an isolation area between photodiodes formed between the photodiodes; an aperture of a metal shielding film which covers the CCDs and the isolation area between CCDs is strip-shaped and is oriented parallel to the arranged CCDs; the solid-state imaging device comprises an insulating film arranged on the photodiode, a flattening layer formed on the insulating film in which the flattening layer is made of a material whose refractive index is higher than that of the insulating film and functions as convex lens, and an on-chip microlens layer for condensing incident light on the flattening layer; and the flattening layer and the on-chip microlens layer are lenticular type and are oriented parallel to the CCDs.

By the solid-state imaging device of the invention, since the signal charges generated by the incident light to the isolation area between photodiodes do not directly enter the CCDs but are appropriately stored in the photodiodes, it is not necessary to shield the isolation area between photodiodes by a metal shielding film. Therefore, the aperture of the metal shielding film can be provided in such a manner that it is a stripe-shaped and is oriented parallel to the arranged CCDs. Consequently, the width of the aperture of the light receiving region is effectively the same as the pixel size in the longitudinal direction of the photodiodes and the area of the aperture can be taken at its maximum. Thus, the sensitivity can be improved. Moreover, since the solid-state imaging device has the on-chip microlens layer and the flattening layer that functions as the convex lens, incident light can efficiently be condensed and the sensitivity can further be improved. Furthermore, since the flattening layer and the on-chip microlens layer are of the lenticular type oriented parallel to the arranged CCDs, the width of the aperture of the light receiving region in the direction perpendicular to the longitudinal direction of the photodiodes can further be widened, and the area of the aperture is further increased. Therefore, incident light can efficiently be condensed on the photodiode, and the sensitivity can further be improved.

Moreover, it is preferable in the above mentioned solid-state imaging device of the invention that the photodiodes and the CCDs are formed as an n-type region; the isolation area between CCDs and the isolation area between the photodiodes are formed as a p-type region; and the dose of implanted ions to the isolation area between the CCDs is greater than that to the isolation area between photodiodes so that the concentration of the p-type region of the isolation area between the CCDs is higher than that of the isolation area between the photodiodes. By such a preferred embodiment, since the p-type region concentration of the isolation area between CCDs is higher than the p-type region concentration of the isolation area between photodiodes, when charges are stored, the potential barrier of the isolation area between CCDs is formed higher than the potential barrier of the isolation area between photodiodes with respect to signal charges. Therefore, signal charges generated by the incident light to the isolation area between photodiodes do not directly enter the CCD but are appropriately stored in the photodiodes. Thus, smearing can be prevented.

BRIEF DESCRIPTION OF DRAWINGS

FIG. 3 is a cross sectional view taken along line Y—Y of FIG. 1;

FIG. 6 is a cross sectional view taken along line X—X of FIG. 5;

FIG. 8 is an enlarged cross sectional view of a part of a light receiving region of a solid-state imaging device of a third embodiment of the invention;

FIG. 9 is a cross sectional view taken along line X—X of FIG. 8;

FIG. 13 is a cross sectional view taken along line Y—Y of FIG. 11; and

DETAILED DESCRIPTION OF THE INVENTION

The embodiments of the invention will be now explained with reference to drawings.

First Embodiment

Figure 1:
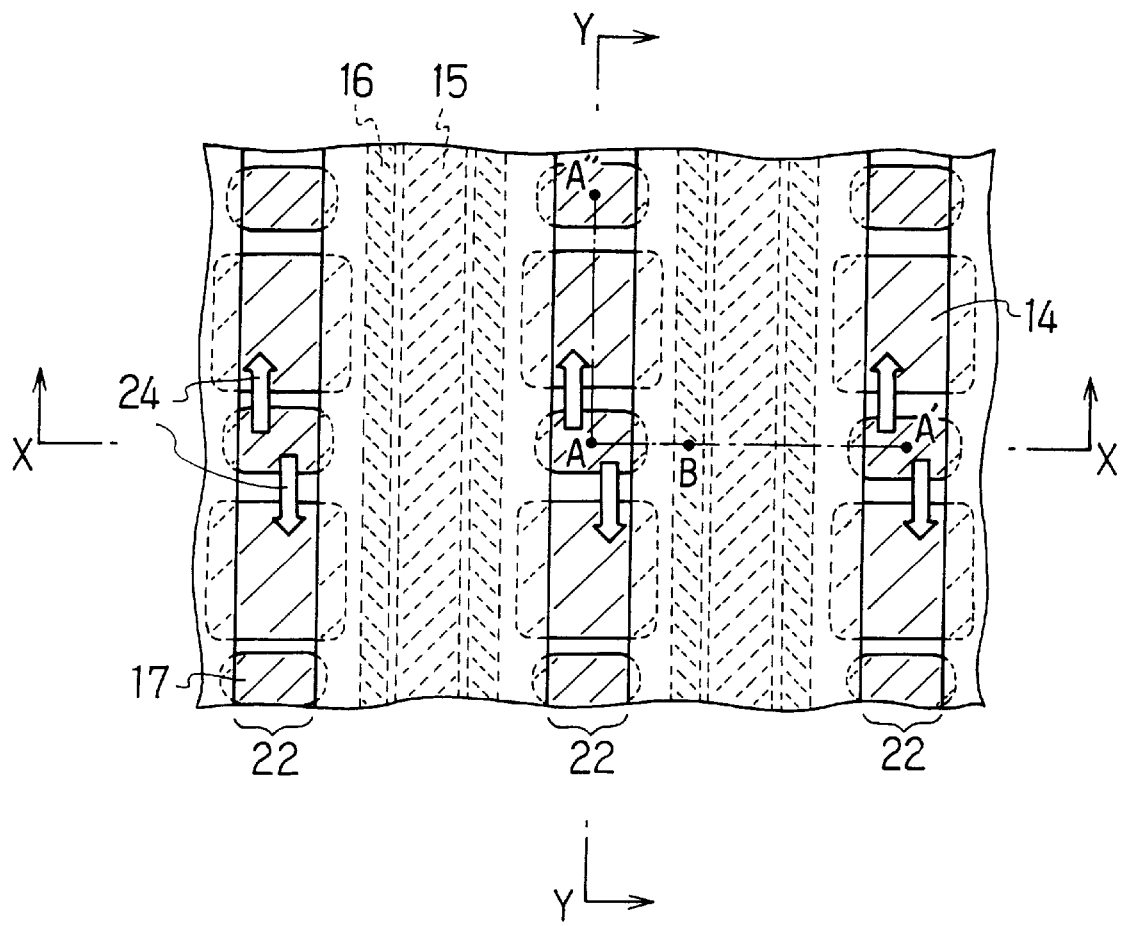
FIG. 1 is an enlarged cross sectional view of a part of a light receiving region of a solid-state imaging device of a first embodiment of the invention.
Figure 2:
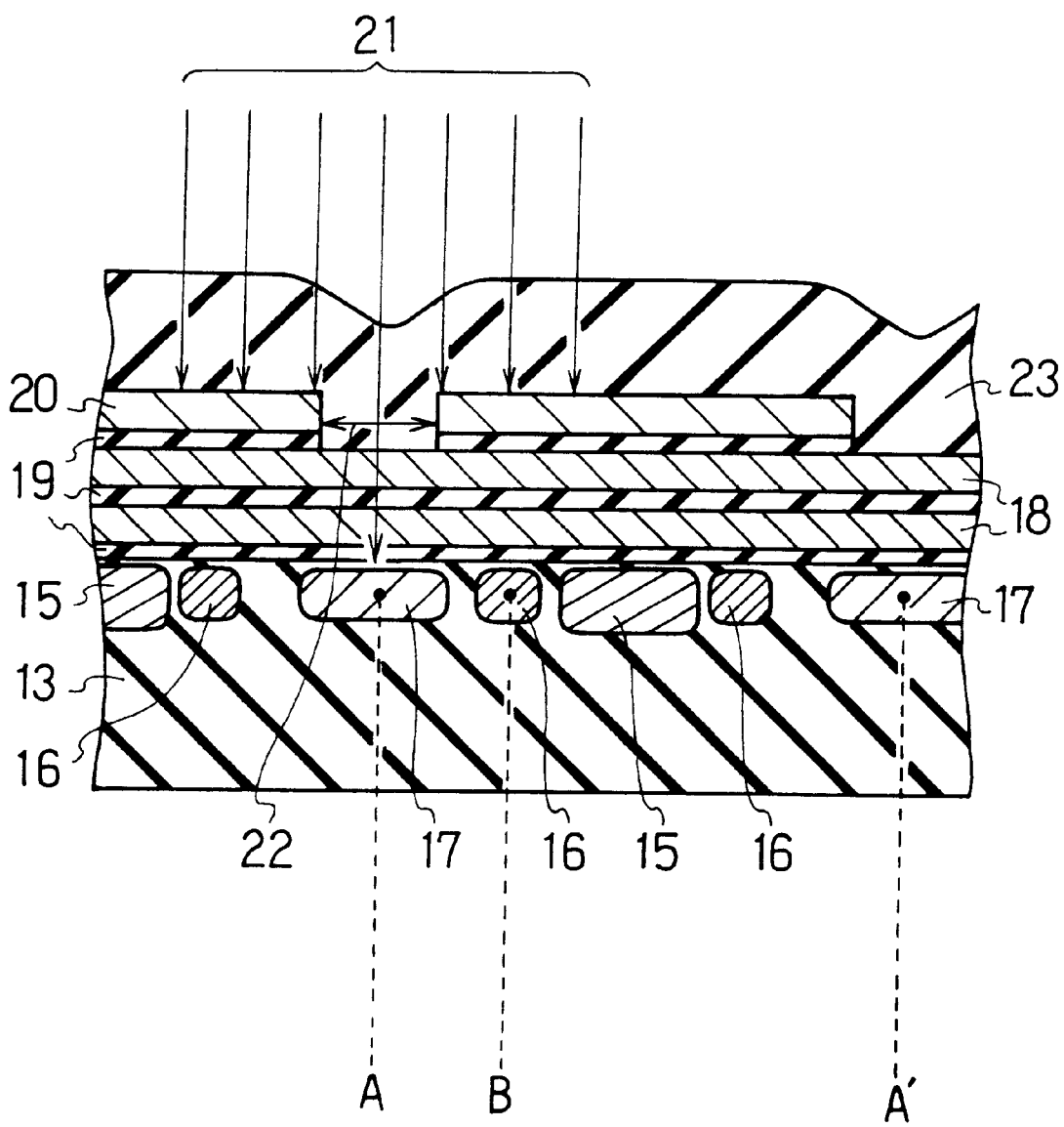
FIG. 2 is a cross sectional view taken along line X—X of FIG. 1.
Figure 4:
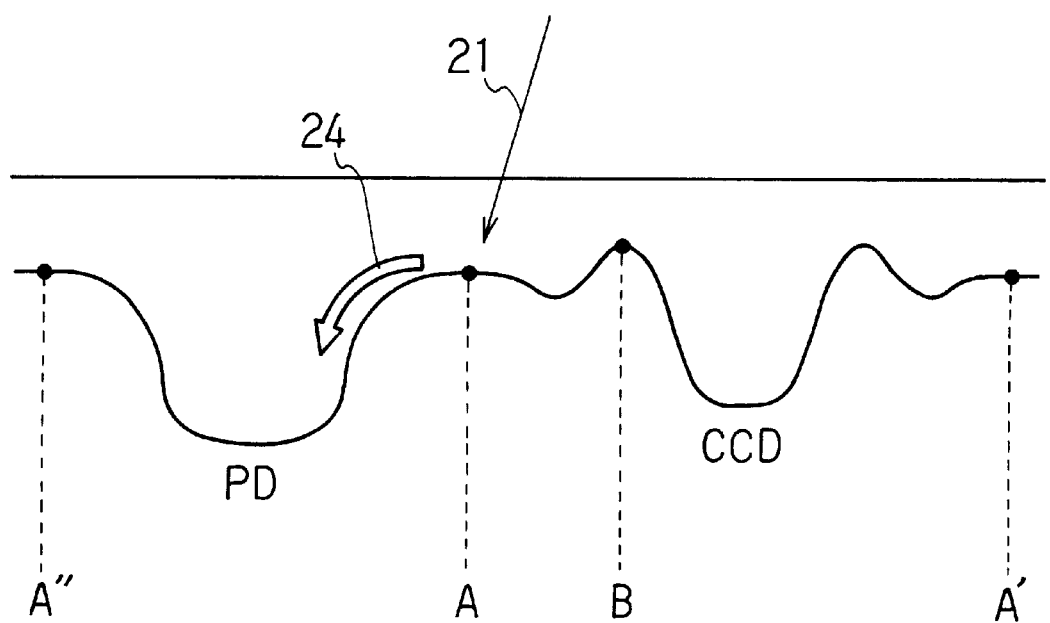
FIG. 4 is a potential distribution when charges are stored at the cross section taken along line A"-A-B-A' of FIGS. 1, 5 and 8.

FIG. 1 is an enlarged plan view of a part of a light receiving region of a solid-state imaging device of the first embodiment of the invention. FIG. 2 is a cross sectional view taken along line X—X of FIG. 1, and FIG. 3 is a cross sectional view taken along line Y—Y of FIG. 1. FIG. 4 is a potential distribution when charges are stored at the cross section taken along line A"-A-B-A' of FIG. 1.

As is apparent from the above mentioned figures, the solid-state imaging device of the first embodiment of the invention comprises a semiconductor substrate 13; a photodiode 14; a vertical CCD 15; an isolation area 16 between CCDs; an isolation area 17 between photodiodes; a polysilicon electrode 18; an oxide film 19; a metal shielding film 20; an aperture 22 of the shielding film and an insulating film 23. Moreover, each figure illustrates the motion 24 of signal charges generated by the incident light 21.

Next, the specific structure of the solid-state imaging device of the invention is explained.

The semiconductor substrate 13 is a silicon mono-crystal. A p-type well is formed on a part forming the light receiving region by implantation of ions. The photodiode 14 is formed in the p-type well by implantation of n-type arsenic, phosphorus, or the like. Similarly, the vertical CCD 15 is formed in the p-type well by implantation of n-type arsenic, phosphorus, or the like.

The isolation area 16 between CCDs is formed between the photodiode 14 and the vertical CCD 15, which forms a potential barrier by implantation of p-type boron, etc. Similarly, the isolation area 17 between photodiodes is formed between neighboring photodiodes 14, which forms a potential barrier by implantation of p-type boron, etc. At this time, if the p-type concentration of the isolation area 16 between CCDs is compared with the p-type concentration of the isolation area 17 between photodiodes, then the dose of ions implanted to the isolation area 16 between CCDs is greater than that to the isolation area 17 between photodiodes.

The polysilicon electrode 18 is formed on the vertical CCD 15. By forming this polysilicon electrode 18 on the vertical CCD 15, the potential of the vertical CCD 15 is controlled. The oxide film 19 is formed on the polysilicon electrode 18 in such a manner that it covers a surface of the polysilicon electrode 18. The metal shielding film 20 is formed on the oxide film 19, and shields the vertical CCD 15 from the incident light 21 to inhibit smearing. The aperture 22 of the shielding film for receiving incident light 21 is formed on the photodiode 14 in such a manner that it is strip-shaped and is oriented parallel to the vertical CCD 15. The insulating film 23 is formed on the metal shielding film 20. This insulating film 23 protects the solid-state imaging device of this embodiment.

Next, the operation of the solid-state imaging device of this embodiment having the above mentioned structure is explained. Signal charges are generated through photoelectric conversion of the incident light 21 by the photodiode 14 formed on the semiconductor substrate 13. Then, these signal charges are read out to the vertical CCD 15.

In this embodiment, if the p-type concentration of the isolation area 16 between CCDs is compared with the p-type concentration of the isolation area 17 between photodiodes, then the dose of implanted ions to the isolation area 16 between CCDs is greater than that to the isolation area 17 between photodiodes by not less than 10%. Thus, when charges are stored, the potential barrier of the isolation area 16 between CCDs (point B) is higher than the potential barrier of the isolation area 17 between photodiodes (point A) (see FIG. 4). Consequently, since signal charges generated by the incident light 21 to the isolation area 17 between photodiodes do not directly enter the vertical CCD 15 but are appropriately stored in the photodiode 14, it is not necessary to shield the isolation area 17 between photodiodes with the metal shielding film 20.

As mentioned above, according to this embodiment, since only the charge transfer portion (the vertical CCD 15 and the isolation area 16 between CCDs) needs to be shielded, the aperture 22 of the shielding film can be provided in such a manner that it is stripe-shaped and is oriented parallel to the vertical CCD 15. Therefore, the width of the aperture 22 of the shielding film is effectively the same as a pixel size in the direction parallel to the vertical CCD 15 (the longitudinal direction of the photodiode), and the area of the aperture can be taken at its maximum. Thus, the sensitivity can be improved.

Second Embodiment

Figure 5:
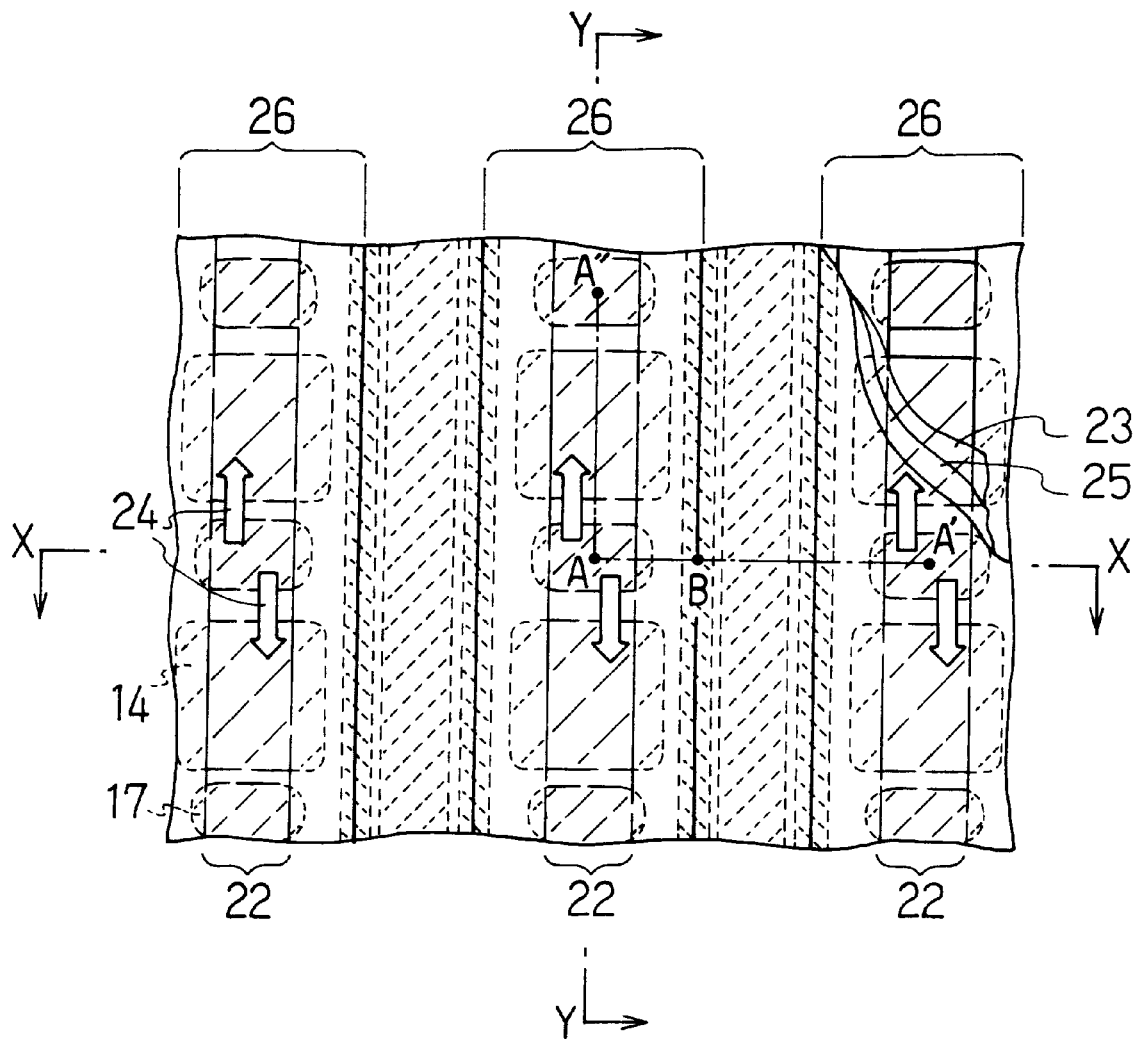
FIG. 5 is an enlarged cross sectional view of a part of a light receiving region of a solid-state imaging device of a second embodiment of the invention.
Figure 7:
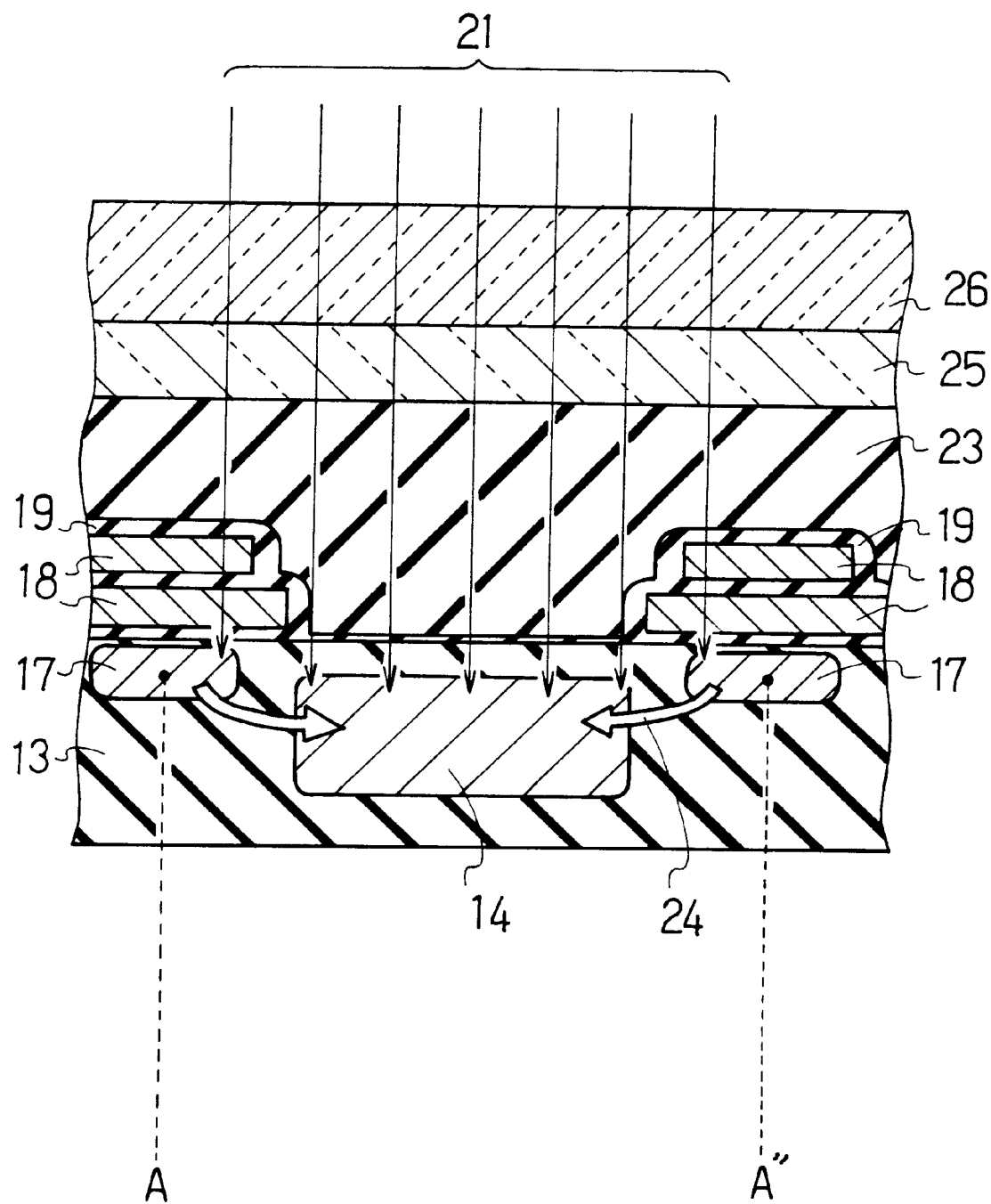
FIG. 7 is a cross sectional view taken along line Y—Y of FIG. 5.

FIG. 5 is an enlarged plan view of a part of a light receiving region of a solid-state imaging device of a second embodiment of the invention. FIG. 6 is a cross sectional view taken along line X—X of FIG. 5, FIG. 7 is a cross sectional view taken along line Y—Y of FIG. 5, and a potential distribution when charges are stored at the cross section taken along line A"-A-B-A' of FIG. 5 is shown in FIG. 4, as in the first embodiment.

As is apparent from the above mentioned figures, the solid-state imaging device of the second embodiment of the invention comprises a semiconductor substrate 13; a photodiode 14; a vertical CCD 15; an isolation area 16 between CCDs; an isolation area 17 between photodiodes; a polysilicon electrode 18; an oxide film 19; a metal shielding film 20; an aperture 22 of the shielding film; an insulating film 23; an on-chip color filter 25 and an on-chip microlens 26. Moreover, each figure illustrates the motion 24 of signal charges generated by the incident light 21.

Next, the specific structure of the solid-state imaging device of the invention is explained.

The semiconductor substrate 13 is a silicon mono-crystal. A p-type well is formed on a part forming the light receiving region by implantation of ions. The photodiode 14 is formed in the p-type well by implantation of n-type arsenic, phosphorus, or the like. Similarly, the vertical CCD 15 is formed in the p-type well by implantation of n-type arsenic, phosphorus, or the like.

The isolation area 16 between CCDs is formed between the photodiode 14 and the vertical CCD 15, which forms a potential barrier by implantation of p-type boron, etc. Similarly, the isolation area 17 between photodiodes is formed between the neighboring photodiodes 14, which forms a potential barrier by implantation of p-type boron, etc. At this time, if the p-type concentration of the isolation area 16 between CCDs is compared with the p-type concentration of the isolation area 17 between photodiodes, then the dose of ions implanted to the isolation area 16 between CCDs is greater than that to the isolation area 17 between photodiodes.

The polysilicon electrode 18 is formed on the vertical CCD 15. By forming this polysilicon electrode 18 on the vertical CCD 15, the potential of the vertical CCD 15 is controlled. The oxide film 19 is formed on the polysilicon electrode 18 in such a manner that it covers a surface of the polysilicon electrode 18. The metal shielding film 20 is formed on the oxide film 19 and shields the vertical CCD 15 from the incident light 21 to prevent smearing. The aperture 22 of the shielding film for receiving the incident light 21 is formed on the photodiode 14 in such a manner that it is strip-shape and is oriented parallel to the vertical CCD 15. The insulating film 23 is formed on the metal shielding film 20. This insulating film 23 protects the solid-state imaging device of this embodiment.

Moreover, the on-chip color filter 25 is formed on the insulating film 23, coloring elements constituting the solid-state imaging device. The on-chip microlens 26 for condensing the incident light 21 on the aperture 22 of the shielding film is formed on the on-chip color filter 25. This on-chip microlens 26 is formed in such a manner that it is of the lenticular type and is oriented parallel to the vertical CCD 15.

Next, the operation of the solid-state imaging device of this embodiment having the above mentioned structure is explained. After the incident light 21 is refracted toward the aperture 22 of the shielding film by the on-chip microlens 26 and passes through the on-chip color filter 25, it enters the photodiode 14 formed on the semiconductor substrate 13 to generate signal charges by photo-electric conversion. Then, these signal charges are read out to the vertical CCD 15.

In this embodiment, because of the lenticular type on-chip microlens 26, the width of the aperture of the light receiving region can also be increased in the direction perpendicular to the longitudinal direction of the photodiode, and the area of the aperture can further be increased. Therefore, the incident light 21 can efficiently be condensed on the photodiode 14, and the sensitivity can be improved.

Moreover, as in the first embodiment, the dose of ions implanted to the isolation area 16 between CCDs is greater than that to the isolation area 17 between photodiodes by not less than 10%. Thus, when charges are stored, the potential barrier of the isolation area 16 between CCDs (point B) is higher than the potential barrier of the isolation area 17 between photodiodes (point A) (See FIG. 4). Consequently, since signal charges generated by the incident light 21 to the isolation area 17 between photodiodes do not directly enter the vertical CCD 15 but are appropriately stored in the photodiode 14, it is not necessary to shield the isolation area 17 between photodiodes with the metal shielding film 20.

As mentioned above, according to this embodiment, since the on-chip microlens 26 is of the lenticular type and is parallel to the vertical CCD 15, the area of the aperture can further be increased and the incident light 21 can be more efficiently condensed on the photodiode 14. Thus, the sensitivity can further be improved.

Moreover, in this embodiment, the lenticular type on-chip microlens 26 is used as the lens to be provided on the on-chip color filter 25, but the invention is not limited to this lens alone. For example, a two-stage lens whose lens curvature in the horizontal direction is different from that in the vertical direction, a dome type on-chip microlens, or the like, may be used.

Moreover, in this embodiment, the on-chip color filter 25 is provided between the insulating film 23 and the on-chip microlens 26, but the invention is not limited to the on-chip color filter alone. For example, a mere transparent flattening layer that does not have spectral characteristics may be provided between the insulating film 23 and the on-chip microlens 26 to obtain similar effect.

Third Embodiment

Figure 10:
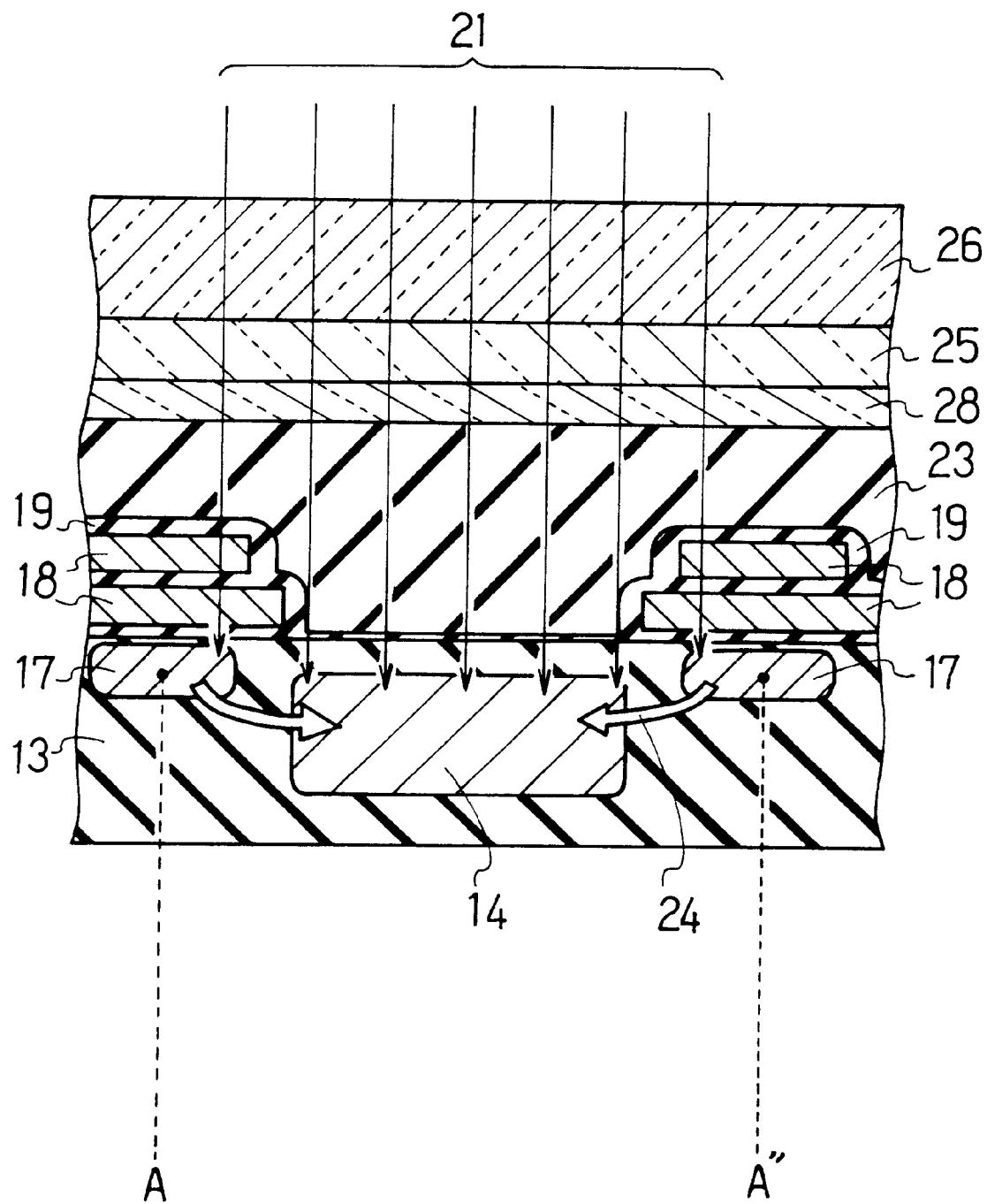
FIG. 10 is a cross sectional view taken along line Y—Y of FIG. 8.
Figure 11:
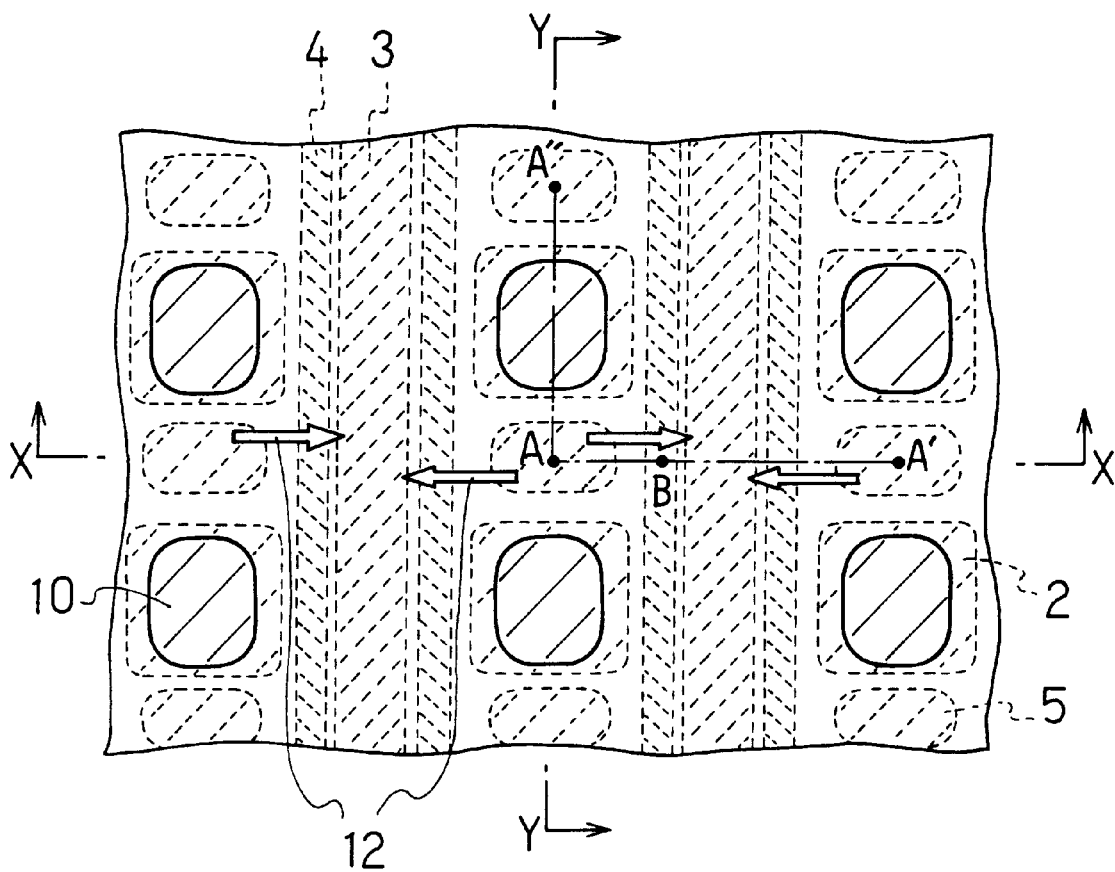
FIG. 11 is an enlarged cross sectional view of a part of a light receiving region of a solid-state imaging device according to the prior art.
Figure 12:
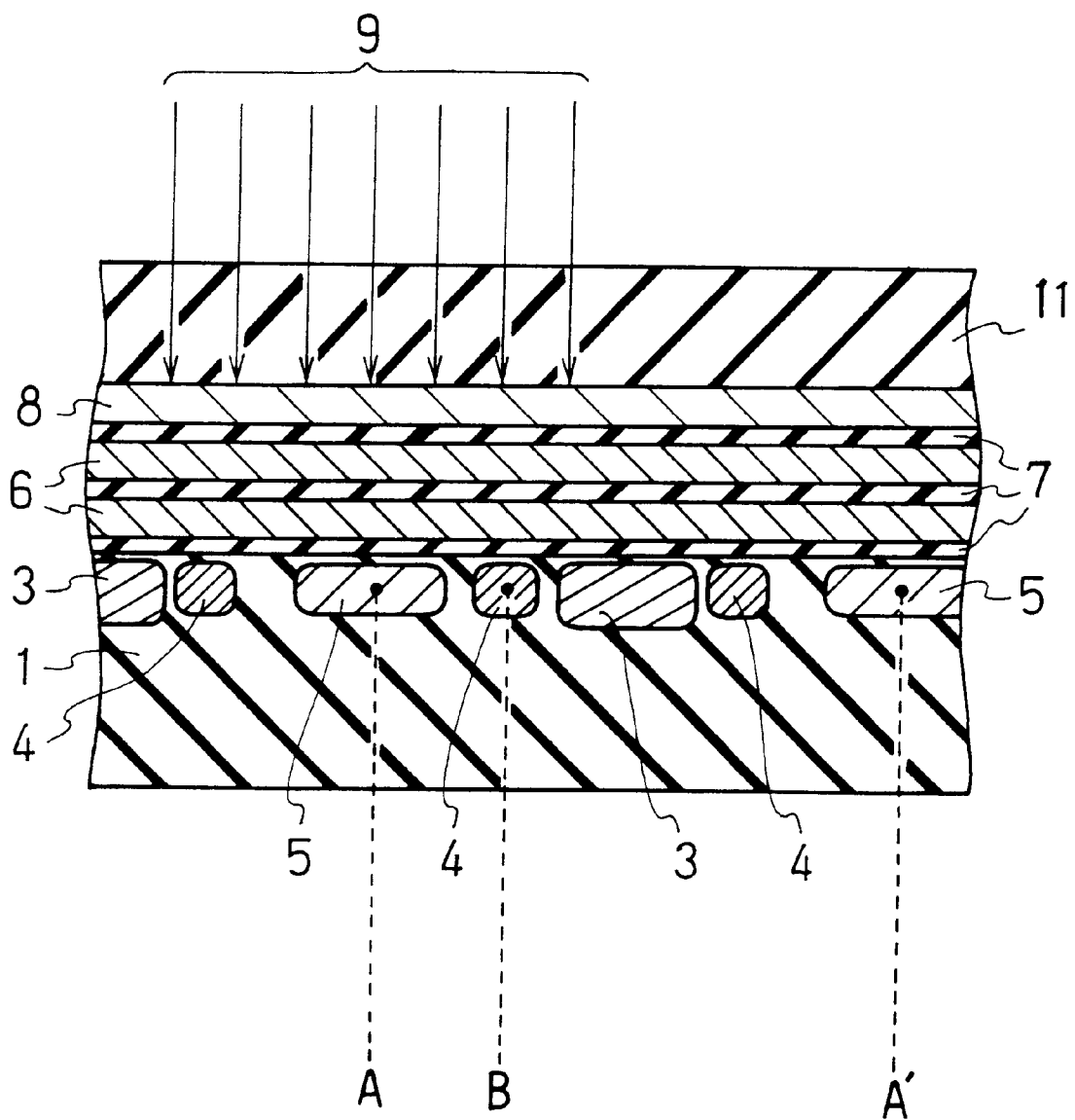
FIG. 12 is a cross sectional view taken along line X—X of FIG. 11.
Figure 14:
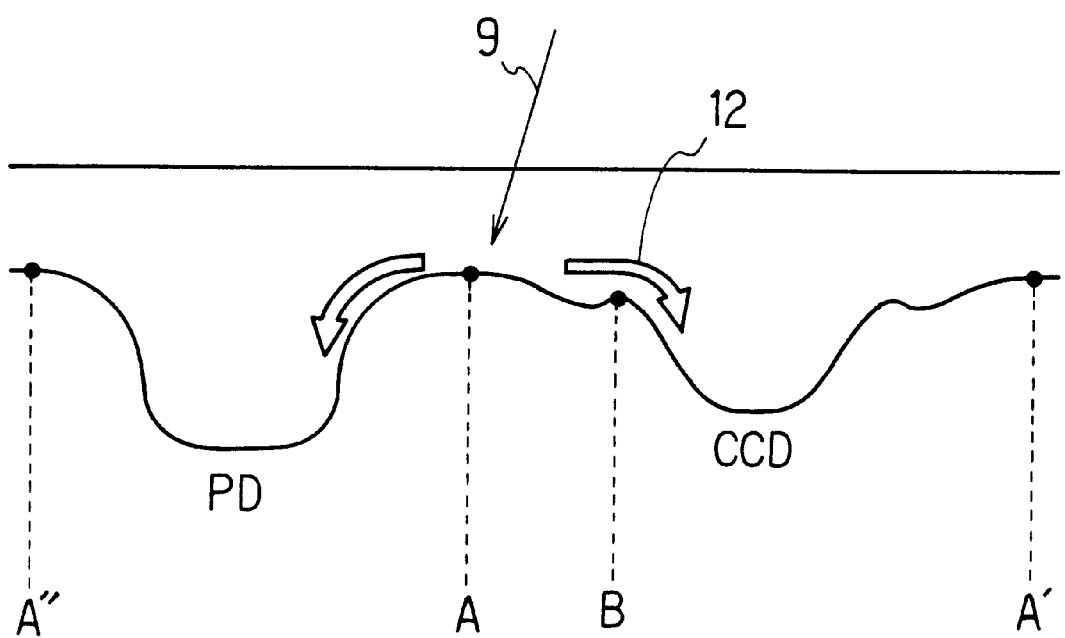
FIG. 14 is a potential distribution when charges are stored at the cross section taken along line A"-A-B-A' of FIG. 11.

FIG. 8 is an enlarged plan view of a part of the light receiving region of a solid-state imaging device of a third embodiment of the invention. FIG. 9 is a cross sectional view taken along line X—X of FIG. 8, FIG. 10 is a cross sectional view taken along line Y—Y of FIG. 8, and a potential distribution when charges are stored at the cross section taken along line A"-A-B-A' of FIG. 8 is shown in FIG. 4, as in the first embodiment.

As is apparent from the above mentioned figures, the solid-state imaging device of the third embodiment of the invention comprises a semiconductor substrate 13, a photodiode 14, a vertical CCD 15, an isolation area 16 between CCDs, an isolation area 17 between photodiodes, a polysilicon electrode 18, an oxide film 19, a metal shielding film 20, an aperture 22 of the shielding film, an insulating film 23, an on-chip color filter 25, an on-chip microlens 26, a flattening layer 27 and an inner-layer microlens 28. Moreover, each figure illustrates the motion 24 of signal charges generated by the incident light 21.

Next, the specific structure of the solid-state imaging device of the invention is explained.

The semiconductor substrate 13 is a silicon mono-crystal. A p-type well is formed on a part forming the light receiving region by implantation of ions. The photodiode 14 is formed in the p-type well by implantation of n-type arsenic, phosphorus, or the like. Similarly, the vertical CCD 15 is formed in the p-type well by implantation of n-type arsenic, phosphorus, or the like.

The isolation area 16 between CCDs is formed between the photodiode 14 and the vertical CCD 15, which forms a potential barrier by implantation of p-type boron, etc. Similarly, the isolation area 17 between photodiodes is formed between neighboring photodiodes 14, which forms a potential barrier by implantation of p-type boron, etc. At this time, if the p-type concentration of the isolation area 16 between CCDs is compared with the p-type concentration of the isolation area 17 between photodiodes, then the dose of ions implanted to the isolation area 16 between CCDs is greater than that to the isolation area 17 between photodiodes.

The polysilicon electrode 18 is formed on the vertical CCD 15. By forming this polysilicon electrode 18 on the vertical CCD 15, the potential of the vertical CCD 15 is controlled. The oxide film 19 is formed on the polysilicon electrode 18 in such a manner that it covers a surface of the polysilicon electrode 18. The metal shielding film 20 is formed on the oxide film 19 and shields the vertical CCD 15 from the incident light 21 to inhibit smearing. The aperture 22 of the shielding film for receiving the incident light 21 is formed on the photodiode 14 in such a manner that it is a strip-shaped and is oriented parallel to the vertical CCD 15. The insulating film 23 is formed on the metal shielding film 20. This insulating film 23 protects the solid-state imaging device of this embodiment.

Moreover, the flattening layer 27 is formed on the insulating film 23, and this flattening layer 27 flattens the step difference in elements constituting the solid-state imaging device. At this time, if any materials having a higher refractive index than that of the insulating film 23 are selected as the materials for forming the flattening layer 27, then a part of the flattening layer 27 functions as a convex lens condensing light on the photodiode 14 that is a light receiving region. A part of the flattening layer 27 constituting this convex lens will hereinafter be referred to as an inner-layer microlens 28. The inner-layer microlens 28 is formed in such a manner that it is of the lenticular type and is oriented parallel to the vertical CCD 15.

The on-chip color filter 25 is formed on the flattening layer 27, coloring elements constituting the solid-state imaging device. The on-chip microlens 26 for condensing the incident light 21 on the aperture 22 of the shielding film is formed on the on-chip color filter 25. This on-chip microlens 26 is formed in such a manner that it is of the lenticular type and is oriented parallel to the vertical CCD 15.

Next, the operation of the solid-state imaging device of this embodiment having the above mentioned structure is explained. The incident light 21 is refracted toward the aperture 22 of the shielding film by the on-chip microlens 26, and passes through the on-chip color filter 25. Further, the incident light 21 is refracted toward the aperture 22 of the shielding film by the inner-layer microlens 28, and enters the photodiode 14 formed on the semiconductor substrate 13. Signal charges are generated through photoelectric conversion of the incident light 21 by the photodiode 14. Then, these signal charges are read out to the vertical CCD 15.

In this embodiment, since the on-chip microlens 26 and the inner-layer microlens 28 are used, the incident light 21 can be condensed. Consequently, the sensitivity can further be improved. Specifically, since the lenticular type on-chip microlens 26 and the inner-layer microlens 28 are provided, the width of the aperture of the light receiving region in the direction perpendicular to the longitudinal direction of the photodiode can also be increased, and the area of the aperture can further be increased. Therefore, the incident light 21 can be more efficiently condensed on the photodiode 14, and the sensitivity can further be improved.

Moreover, similarly to the first embodiment, the dose of ions implanted to the isolation area 16 between CCDs is greater than that to the isolation area 17 between photodiodes by not less than 10%. Thus, when charges are stored, the potential barrier of the isolation area 16 between CCDs (point B) is higher than the potential barrier of the isolation area 17 between photodiodes (point A) (See FIG. 4). Consequently, since signal charges generated by incident light 21 to the isolation area 17 between photodiodes do not directly enter the vertical CCD 15 but are appropriately stored in the photodiode 14, it is not necessary to shield the isolation area 17 between photodiodes with the metal shielding film 20.

As mentioned above, according to the embodiment, since the inner-layer microlens 28 is of the lenticular type and is oriented parallel to the vertical CCD 15, the incident light 21 can be condensed more efficiently on the photodiode 14. Thus, the sensitivity can further be improved.

Moreover, in this embodiment, both the on-chip microlens 26 and the inner-layer microlens 28 are of the lenticular type and are oriented parallel to the vertical CCD, but the invention is not limited to this configuration alone. For example, either lens or both lenses may be of the dome type. Moreover, any combinations of other types of lens may be used.

Moreover, in this embodiment, the on-chip microlens 26 is explained, but the invention is not limited to the on-chip microlens alone. That is, the same effect can be obtained using other lenses and not the on-chip microlens 26.

Moreover, in this embodiment, the on-chip color filter 25 is explained, but the invention is not limited to the on-chip color filter alone. That is, the same effect can be obtained using other filters and not the on-chip color filter 25, the same effect can be obtained.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A solid-state imaging device having a light receiving region, comprising:

a plurality of photodiodes arranged in columns on the light receiving region;

a plurality of charge coupled devices (CCDs) arranged in columns in alternations with the columns of photodiodes;

a first isolation area having a first potential barrier, said first isolation area being formed on both sides of each column of said plurality of CCDs; and a second isolation area having a second potential barrier, said second isolation area being formed between said plurality of photodiodes, wherein when charges are stored on the solid-state imaging device, the first potential barrier of the first isolation area being formed to be higher than the second potential barrier of the second isolation area.

2. The solid-state imaging device of claim 1, further comprising a light shielding film for covering only said plurality of CCDs and said first isolation area.

3. The solid-state imaging device of claim 1, further comprising an on-chip microlens layer for condensing incident light on said plurality of photodiodes.

4. The solid-state imaging device of claim 3, wherein said on-chip microlens layer is a lenticular type and is oriented parallel to said plurality of CCDs.

5. The solid-state imaging device of claim 1, further comprising:

an insulating film arranged on said plurality of photodiodes; and a flattening layer formed on said insulating film, wherein said flattening layer is made of a material whose refractive index is higher than the refractive index of said insulating film, and said flattening layer functions as a convex lens.

6. The solid-state imaging device of claim 5, wherein said flattening layer is a lenticular type and is oriented parallel to said plurality of CCDs.

7. The solid-state imaging device of claim 1, wherein said plurality of photodiodes and CCDs are formed as an n-type region, said first and second isolation areas are formed as a p-type region, and the concentration of the p-type region of the first isolation area is higher than the concentration of the p-type region of the second isolation area.

* * * * *